United States Patent
Choi

(10) Patent No.: US 10,249,100 B2
(45) Date of Patent: Apr. 2, 2019

(54) METHOD AND SYSTEM FOR PROGRESSIVE DRAPE UPDATE ON AVATAR MORPH FOR VIRTUAL FITTING

(71) Applicant: Bong Ouk Choi, Seoul (KR)

(72) Inventor: Bong Ouk Choi, Seoul (KR)

(73) Assignee: PHYSAN, INC., Seoul (KR)

( * ) Notice: Subject to any disclaimer, the term of this patent is extended or adjusted under 35 U.S.C. 154(b) by 0 days.

(21) Appl. No.: 15/689,435

(22) Filed: Aug. 29, 2017

(65) Prior Publication Data

US 2018/0061141 A1 Mar. 1, 2018

Related U.S. Application Data

(60) Provisional application No. 62/380,970, filed on Aug. 29, 2016, provisional application No. 62/420,237, filed on Nov. 10, 2016.

(51) Int. Cl.
*G06F 17/50* (2006.01)
*G06T 19/20* (2011.01)
*G06Q 30/06* (2012.01)

(52) U.S. Cl.
CPC .............. *G06T 19/20* (2013.01); *G06F 17/50* (2013.01); *G06Q 30/0623* (2013.01); *G06T 2200/04* (2013.01); *G06T 2200/08* (2013.01); *G06T 2215/16* (2013.01)

(58) Field of Classification Search
None
See application file for complete search history.

(56) References Cited

U.S. PATENT DOCUMENTS

| | | | |
|---|---|---|---|
| 2010/0097395 A1* | 4/2010 | Chang | A63F 13/12 345/619 |
| 2014/0277683 A1* | 9/2014 | Gupta | G06F 17/50 700/132 |
| 2015/0154453 A1* | 6/2015 | Wilf | G06K 9/00711 382/103 |
| 2016/0110595 A1* | 4/2016 | Wang | G06K 9/00375 705/27.2 |

* cited by examiner

*Primary Examiner* — Said Broome
(74) *Attorney, Agent, or Firm* — John K. Park; Park Law Firm

(57) ABSTRACT

A method for progressive drape update on avatar morph for a virtual fitting system comprises steps for providing an infrastructured avatar for a three-dimensional body, providing an OBJ avatar, providing a garment, draping the garment on the infrastructured avatar, providing a morphable avatar so as to wrap the infrastructured avatar, performing metamorphosis of the morphable avatar from the infrastructured avatar to the OBJ avatar so as to provide a plurality of transitioning shapes of the morphable avatar, applying physically-based simulation of draping the garment to the plurality of transitioning shapes of the morphable avatar, and displaying the garment draped on the OBJ avatar on the screen of the information processing device using a result of the physically-based simulation of draping with the last frame of the morphable avatar.

18 Claims, 11 Drawing Sheets

Fig. 6
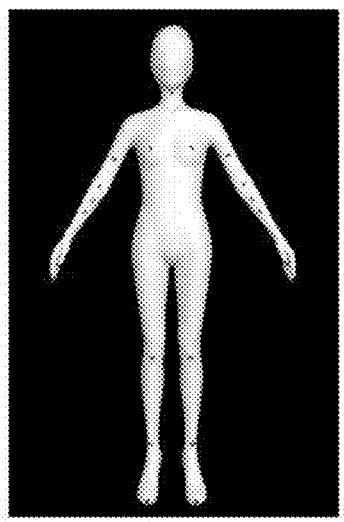 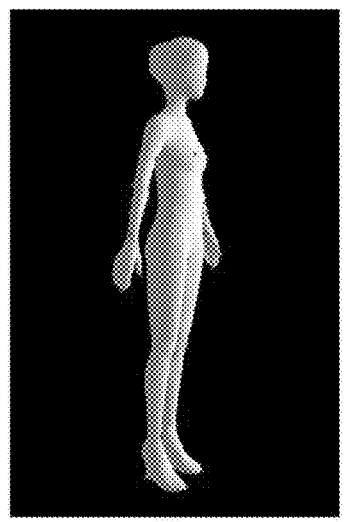 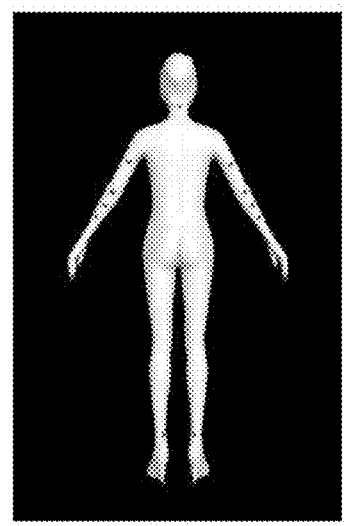
front　　　　　　　　　　side　　　　　　　　　　back

Fig. 7
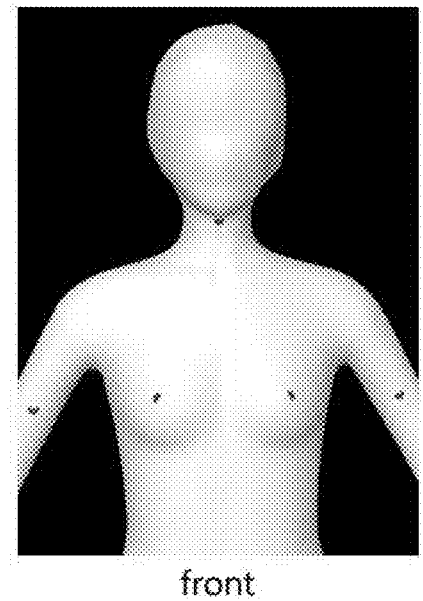
front
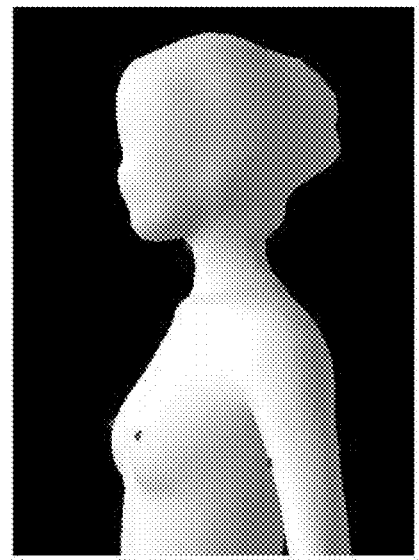
side

Fig. 8
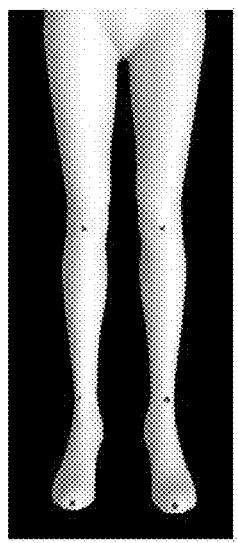
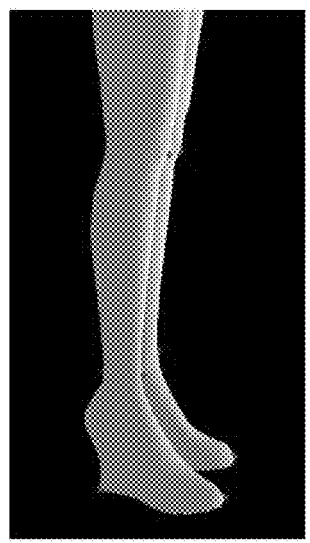
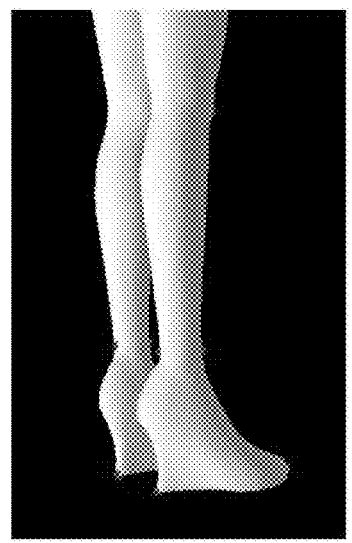
front　　　　　side 1　　　　　side 2

Fig. 11

```
# List of geometric vertices, with (x,y,z[,w]) coordinates, w is optional and defaults to 1.0.
v 0.123 0.234 0.345 1.0
v ...
...
# List of texture coordinates, in (u, v [,w]) coordinates, these will vary between 0 and 1, w is optional and defaults to 0.
vt 0.500 1 [0]
vt ...
...
# List of vertex normals in (x,y,z) form; normals might not be unit vectors.
vn 0.707 0.000 0.707
vn ...
...
# Parameter space vertices in ( u [,v] [,w] ) form; free form geometry statement ( see below )
vp 0.310000 3.210000 2.100000
vp ...
...
# Polygonal face element (see below)
f 1 2 3
f 3/1 4/2 5/3
f 6/4/1 3/5/3 7/6/5
f 7//1 8//2 9//3
f ...
...
```

METHOD AND SYSTEM FOR PROGRESSIVE DRAPE UPDATE ON AVATAR MORPH FOR VIRTUAL FITTING

RELATED APPLICATION

This application is a Non-provisional Application of Provisional Application Ser. Nos. 62/420,237 for "Progressive Drape Update on the Avatar Morph for Virtual Fitting" filed on Nov. 10, 2016 and 62/380,970 for "Progressive Drape Update on the Avatar Morph for Virtual Fitting" filed on Aug. 29, 2016.

BACKGROUND OF THE INVENTION

The present invention relates to a method and system for progressive drape update on avatar morph for virtual fitting.

The need for a method and system for progressive drape update on avatar morph for virtual fitting has been present for a long time considering the expansive demands in the everyday life. This invention is directed to solve these problems and satisfy the long-felt need.

SUMMARY OF THE INVENTION

The present invention contrives to solve the disadvantages of the prior art.

An aspect of the invention provides a method and system for progressive drape update on avatar morph for virtual fitting.

The method for progressive drape update on avatar morph for a virtual fitting system comprises steps for:

providing an infrastructured avatar for a three-dimensional body for manipulating in an information processing device and displaying on a screen of the information processing device;

providing an OBJ avatar for a three-dimensional body for manipulating in the information processing device and displaying on the screen of the information processing device;

providing a garment for manipulating in the information processing device and displaying on the screen of the information processing device;

draping the garment on the infrastructured avatar in the information processing device;

providing a morphable avatar so as to wrap the infrastructured avatar in the information processing device;

performing metamorphosis of the morphable avatar from the infrastructured avatar to the OBJ avatar so as to provide a plurality of transitioning shapes of the morphable avatar in the information processing device;

applying physically-based simulation of draping the garment to the plurality of transitioning shapes of the morphable avatar in the information processing device; and displaying the garment draped on the OBJ avatar on the screen of the information processing device using a result of the physically-based simulation of draping with the last frame of the morphable avatar.

The infrastructured avatar may comprise a body, a head, and hairs, a plurality of collision caps that wrap hands, feet, the head, and the hairs; a skeleton; a plurality of meshes provided for portions on surfaces of the infrastrutured avatar for the body and the head, and the body mesh may be rigged with respect to the skeleton, so that the body mesh is configured to deform as skeletal joint angles vary.

The plurality of meshes may further comprise meshes for the hairs and eyeballs.

The infrastructured avatar may further comprise one or more non-avatar components such as a plurality of garment layer cylinders.

The OBJ avatar may be provided by and imported from a 3D body scanning system, and the OBJ avatar may have a single mesh including body, head, and hairs.

The garment may be constructed by positioning and seaming panels for the garment, and each of the panels may be represented with coordinate data for points and lines forming the panel in the information processing device.

The morphable avatar may comprise a single mesh and may be configured to wrap the infrastructured avatar, the OBJ avatar, and the transitioning shapes from the infrastructured avatar to the OBJ avatar.

The steps for performing metamorphosis and applying physically-based simulation may comprise a step for performing progressively physically-based update of draping of the garment on the morphable avatar as the infrastructured avatar morphs to the OBJ avatar.

The plurality of transitioning shapes of the morphable avatar may comprise from about ten (10) to about thirty (30) frames.

The OBJ avatar may be represented by and given with an OBJ file (a geometry definition file format containing geometric vertices, texture coordinates, vertex normal and polygon faces) in an OBJ format.

The OBJ avatar may be represented by and given with a landmarked OBJ protocol comprising the OBJ file and an OBJ landmark index (OBLIND) file containing a plurality of OBJ landmark indices (OBLINDs) for a plurality of landmarks on the OBJ avatar in a simple TXT format, and wherein the landmarks are marked at corresponding portions in both the morphabelavatar and the infrastructured avatar.

The landmarks may comprise Adam's Apple, Rear Adam's Apple, L-Inner Elbow, R-Inner Elbow, L-Medial Wrist, R-Medial Wrist, L-Lateral Wrist, R-Lateral Wrist, L-Thumb Tip, R-Thumb Tip, L-Middle Finger Tip, R-Middle Finger Tip, L-Front Ankle, R-Front Ankle, L-Rear Ankle, R-Rear Ankle, L-Foot Tip, R-Foot Tip, L-Heel, and R-Heel.

The OBLIND file may include lists of indices of the landmarks in a specific order.

The morphable avatar may be made to wrap the OBJ avatar with a constraint that in a wrapped result corresponding landmarks of the morphable avatar and the OBJ avatar coincide to each other.

The plurality of transitioning shapes of the morphable avatar may comprise from about ten (10) to about thirty (30) frames including a first frame and a last frame, and the first frame may be a wrapping of the infrastructured avatar and the last frame is a wrapping of the OBJ avatar.

The landmarked OBJ protocol may comprise the OBJ file and an OBLPIND text file listing about forty three (43) OBJ landmark vertex indices.

The OBLPIND text file may have a first line indicating information on the avatar, and the OBLPIND text file may list the OBJ landmark vertex indices in a predetermined order.

The OBJ landmark vertices may comprise about twenty eight (28) vertices in arms, about four (4) vertices in an upper body, and about eleven (11) vertices in a lower body.

The vertices in the arms may be located at armpit, bicept front, bicept back, elbow front, elbow outer, elbow back, lower arm inner 70%, lower arm outer 70%, lower lower arm outer 40%, wrist inner, wrist outer, thumb tip, and middle finger tip. The vertices in the upper body may be located at Adam's apple front, Adam's apple back, left nipple, and right nipple, and the vertices in the lower body may be located at crotch, knee front, ankle front, ankle back, foot tip, and heel.

The advantages of the present invention include: (1) the method and system for progressive drape update on avatar morph speeds up the virtual fitting system so that the customers do not need to wait in front of the virtual fitting system; (2) the method according to the invention shows the draping of a garment to a body generated from a body scanning system; (3) the PDU presented in this document is a simple but practically important idea when implementing a virtual fitting system; (4) the proposed idea is based on the observation that draping a garment anew is more difficult than PDUing an pre-draped garment, while the avatar is made to morph to the customer body shape; and (5) to our knowledge, the idea of using PDU for realizing the virtual fitting system is novel, and there has been no virtual fitting systems so far that is developed based on the PDU.

Although the present invention is briefly summarized, the fuller understanding of the invention can be obtained by the following drawings, detailed description and appended claims.

BRIEF DESCRIPTION OF THE DRAWINGS

These and other features, aspects and advantages of the present invention will become better understood with reference to the accompanying drawings, wherein:

FIG. 6 shows a plurality of second exemplary OBJ landmarks for the arms according to an embodiment of the invention;

FIG. 7 shows a plurality of second exemplary OBJ landmarks for an upper body according to an embodiment of the invention;

FIG. 8 shows a plurality of second exemplary OBJ landmarks for a lower body according to an embodiment of the invention;

FIG. 11 shows an example of an OBJ format according to an embodiment of the invention.

DETAILED DESCRIPTION EMBODIMENTS OF THE INVENTION

The U.S. Provisional Patent Application Nos. 62/420,237 for "Progressive Drape Update on the Avatar Morph for Virtual Fitting" filed on Nov. 10, 2016 and 62/380,970 for "Progressive Drape Update on the Avatar Morph for Virtual Fitting" filed on Aug. 29, 2016 are incorporated by reference herein for any and all purposes.

Additionally, the U.S. patent application Ser. No. 15/641,740 for "Method and System for CIG-mode Rendering" filed on Jul. 5, 2017 and Ser. No. 15/641,797 for "Method and System for Automatic Garment Fit Customization" filed on Jul. 5, 2017, by the applicant are incorporated by reference into this disclosure as if fully set forth herein.

Figure 1:
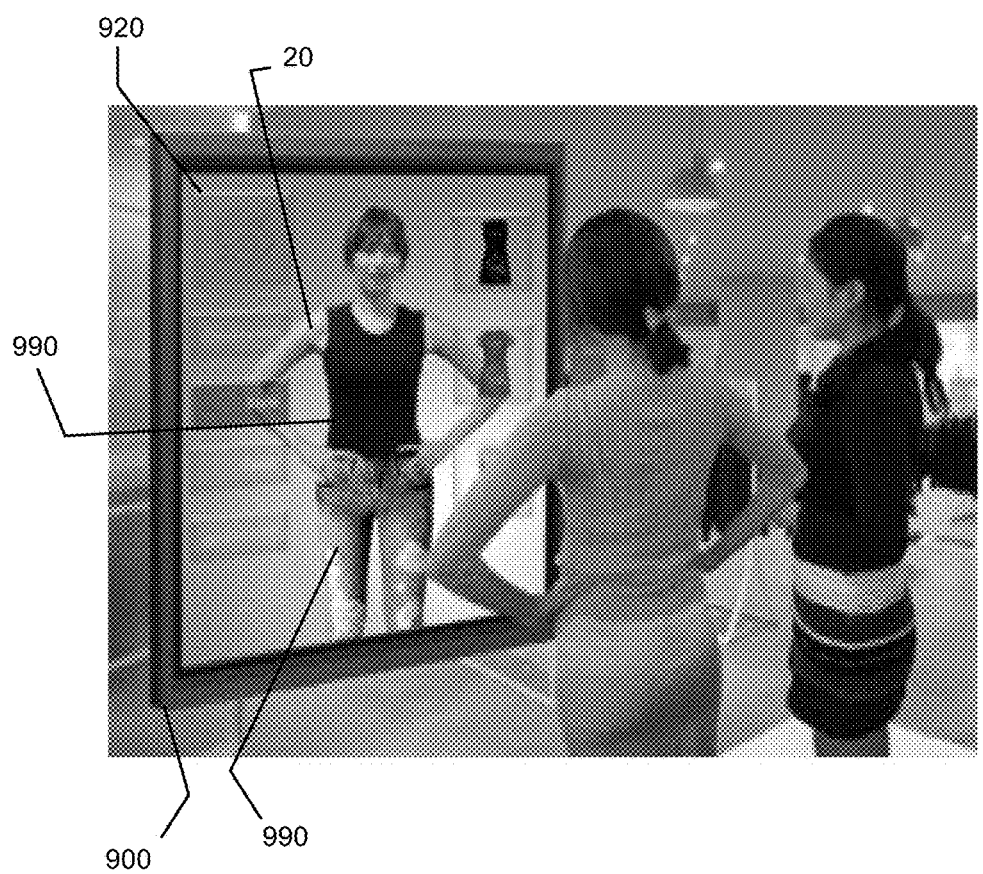
FIG. 1 is a perspective view of an application of a virtual fitting system according to an embodiment of the invention.

The proposed invention is used for implementing the virtual fitting system, which should interactively show the draping of the given garment to the novel body OBJ that is generated from a body scanning system as shown in FIG. 1.

If the (physically-based) draping of the garment on the standard body Body 1 is available, then updating that drape to a novel body Body 2 is easier (faster and problem-free) than draping the garment afresh directly to Body 2. This observation can be used to speed up the VFS by pre-computing the draping of the clothing products to the standard body, so that the customers do not need to wait in front of the VFS.

The 3D garment is constructed from the panels (i.e., sewing patterns). More specifically, for constructing a 3D garment, in the apparel CAD software, the fashion expert meticulously positions the panels around the body then stitches the corresponding line pairs. In summary, to construct a 3D garment, the panels should be (1) positioned and (2) seamed. Since the construction takes some time, it is out of question to do it in the presence of the customer. So from now on, we will assume the construction part is already complete.

Even if the construction is complete, a satisfactory draping is not given by simply starting the dynamic simulation. In the first few frames, as the panels find their positions in the process of being stitched, they can go into the body or they can inter-penetrate each other. Without the presence of a 3D garment construction expert, the simulation can produce anomalous result. Even if an expert made it to work for a body, if the same setup is applied to a different body, the draping afresh can encounter problems. That is why draping fresh should be avoided in the development of a VFS.

Since the problems occur in the first few frames, if we start from a state in which the draping is already complete (i.e., no panel penetrates the body or other panels), the above problems can be alleviated. That is the major reason to come up with the proposed progressive drape update (PDU) algorithm.

Figure 2:
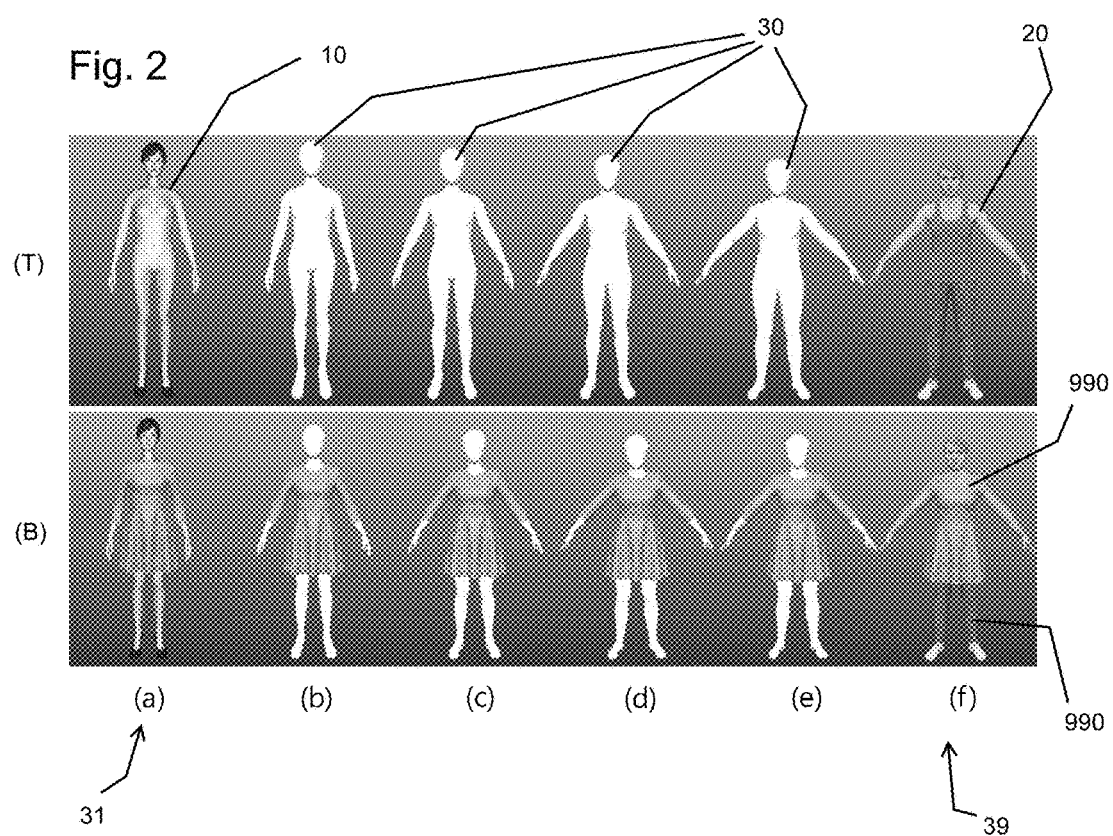
FIG. 2 shows (Ta) an infrastructured avatar, (Tb)~(Te) metamorphosis of a morphable avatar, (Tf) an OBJ avatar at the top row, and (Ba)~(Bf) PDUs for the avatars according to an embodiment of the invention.
Figure 3:
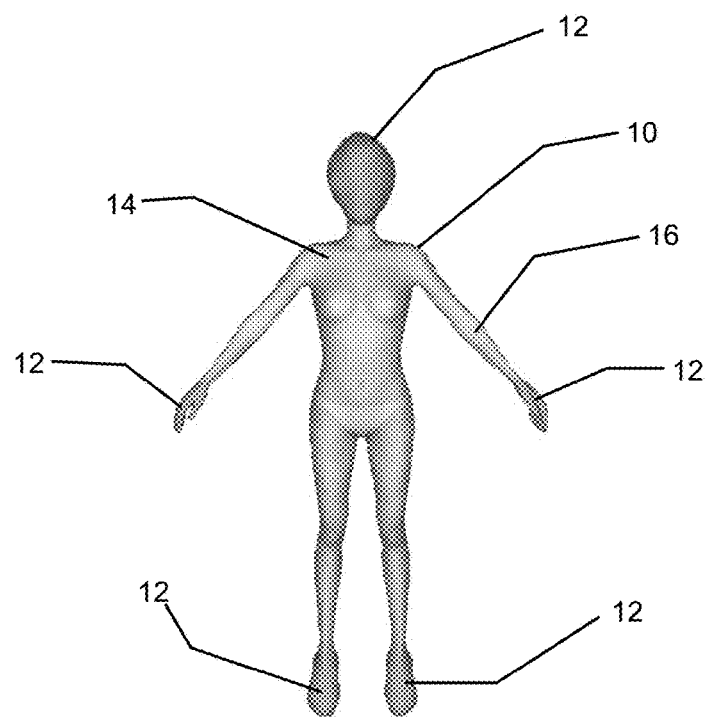
FIG. 3 is a front view of an infrastructured avatar with collision caps on according to an embodiment of the invention.

FIG. 2 shows avatar and PDUs according to embodiments of the invention.

The avatar that is used for physically-based draping of 3D clothing (hereafter we call it the "infrastructured avatar") consists of the body, head, and hair.

Additionally, for the purpose of simplifying the collision handling, the infrastructured avatar has a number of caps that wrap the hands, feet, head and hair, as shown in the figure on the top. We call them the collision caps. The collision caps are used only for the internal collision-related calculation, without being visualized. The normal look of the infrastructured avatar 10 is shown in FIG. 2(Ta).

The infrastructured avatar has the skeleton as well as the body mesh. Often the avatar surface consists of multiple meshes; For example, in the infrastructured avatar, in addition to the mesh comprising the body and head, separate extra meshes are used for the hair and eye balls. The body mesh is rigged with respect to the skeleton so that the body mesh deforms as the skeletal joint angles vary. Often, the infrastructured avatar additionally equips with the auxiliary non-avatar components such as the garment layer cylinders, as shown in the figure on the bottom. In summary, the infrastructured avatar, which is suited for physically-based draping simulation, is a complex with various infrastructures built in it.

On the contrary, the avatar imported from a 3D scanning system (we will call it the OBJ avatar 20 since it is usually given in the OBJ format) is simple. It consists of usually a single mesh in which the body, head, and hair are all included. An example is shown in FIG. 2(Tf). Since the OBJ avatar is not equipped with the infrastructures, constructing and simulating clothes on it is more difficult than when the same job is done on the infrastructured avatar. An ideal thing would be the imported OBJ avatar can be converted to the infrastructured avatar. Due to the structural difference, a complete conversion is difficult: (1) it can take time, and (2) the conversion may be occasionally unsuccessful. In the context of developing a virtual fitting system, which should provide real-time service to the customer, the above imperfect and error-prone conversion is not a practically viable option.

But as proposed in this patent application, there is a way the infrastructure and OBJ avatars can be related to enable the simulation of the customer-selected clothing on the OBJ body.

We propose to use an avatar that can mediate between the OBJ and infrastructured avatars. We call that avatar as the morphable avatar. The morphable avatar can be seen in FIG. 2(Tb)~(Te).

The morphable avatar has the following characteristics:
It consists of a single mesh.
It has no skeleton, thus no rigging is defined.
It can be made to wrap the infrastructured avatar or a OBJ avatar, as shown in FIGS. 2(b) and (e), respectively. Here, "wrap" means the morphable avatar mesh tightly wraps the infrastructured/OBJ avatar such that, although the meshes are different in the topology, their geometrical shape takes on the infrastructured/OBJ avatar. In such a case, we will call the morphable avatar as the wrapper and the infrastructured/OBJ avatar as the wrappee.

One use of the morphable avatar proposed in this proposal is to mediate the infrastructured and OBJ avatars in order to clothe the OBJ avatar. We note that clothing a infrastructured avatar is easier than clothing an OBJ avatar due to the built-in infrastructures. The idea is to firstly complete the construction and draping afresh of the garment the infrastructured avatar, then progressively perform physically-based update of the draping as we make the infrastructured avatar morph to the OBJ avatar. We will call this method the progressive drape update (PDU), and the morphing from the infrastructured avatar to the OBJ avatar as the metamorphosis. FIG. 2(T) shows the metamorphosis and FIG. 2(B) shows the PDU over the metamorphosis.

More specifically, suppose that a garment has been already draped on a infrastructured body as shown in FIG. 2(Ba). Then, the progressive drape update algorithm works in the following way.

1. Morphable Avatar Wraps the infrastructured avatar: The morphable avatar is made to wrap the infrastructured avatar. (FIG. 2(Tb))
2. Metamorphosis: The mesh comprising morphable avatar is made to gradually (e.g., over 10~30 frames) morph from the shape of the infrastructured avatar to that of the given OBJ avatar. (FIG. 2(Tb)~(Te))
3. Progressive Drape Update: The physically-based simulation is now run as the morphable avatar makes the metamorphosis. (FIG. 2(Bb)~(Be))
4. Show the Result with the OBJ Avatar: When the PDU is complete, show the draped clothes with the OBJ avatar. (FIG. 2(Bf))

To enable the metamorphosis between the full and OBJ avatars, we need to establish the correspondence between those two avatars. For that purpose, it is expected that the vendor of the 3D body scanning system provides, in addition to the OBJ file, so-called the OBJ landmark index (OBLIND) file (to the virtual fitting program), which contains the OBJ landmark indices (OBLINDs) in the simple TXT format. We will call the package (the OBJ file and the accompanying OBLIND file) as the landmarked OBJ. Of course, those landmarks are already marked in both the morphable avatar and the infrastructured avatar.

Figure 5:
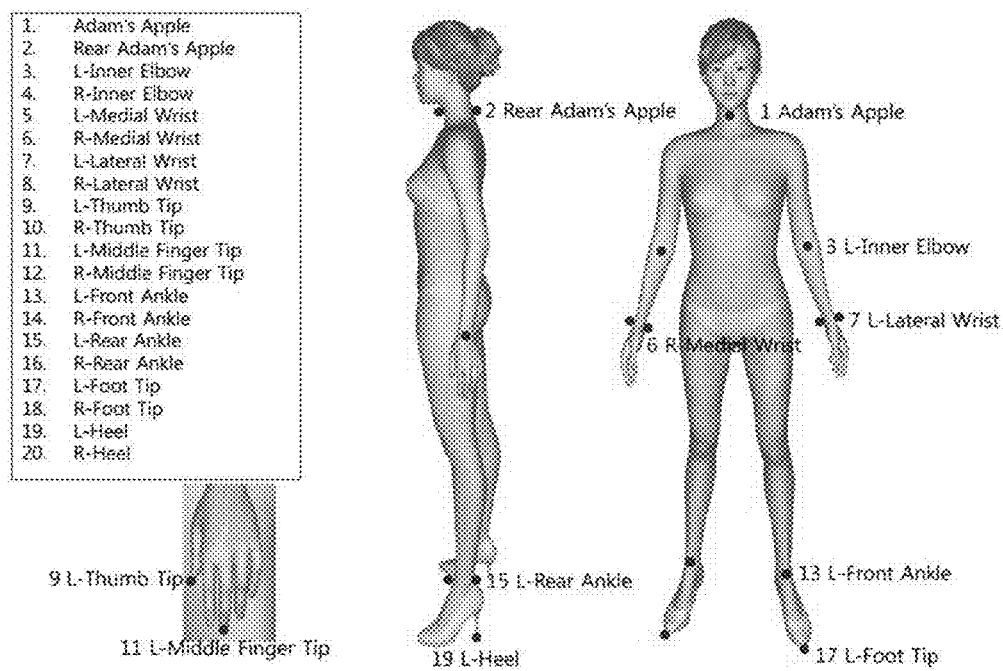
FIG. 5 shows a plurality of first exemplary OBJ landmarks according to an embodiment of the invention.

As shown in FIG. 5, the OBJ landmarks consist of the Adam's Apple, Rear Adam's Apple, L-Inner Elbow, etc. as summarized in the next page's table and figure. The included TXT file DBLIND.txt is a sample OBLIND file that lists the vertex indices of the OBJ landmarks in the order shown in the above table. If there are multiple candidate vertices (vague) for the landmark, any one of them can be chosen. The landmark vertices designation does not need to be done too meticulously, since the result is not very sensitive to the selection.

If the landmarks existing in both the full and the morphable avatars are marked in the OBJ as described above, then the morphable avatar can be made to wrap OBJ body (as well as the full body) with the constraint that, in the wrapped result, the corresponding landmarks of the two avatars should coincide to each other. This constraint prevents the wrapping being done arbitrarily.

PDU with Landmarked OBJ:
1. Complete clothing the infrastructured avatar.
2. Wrap the infrastructured avatar: Make the morphable avatar wrap the infrastructured avatar. By this operation, the morphable avatar takes on the geometry of the infrastructured avatar, although the mesh topology comes from the morphable avatar.
3. Import the OBJ avatar: By providing the avatar OBJ and OBLIND.txt, open the OBJ avatar.
4. Metamorphosis: The metamorphosis produces a number of transitioning shapes of the morphable avatar, in which the first frame is the infrastructured avatar wrap, and the last frame is the OBJ avatar wrap. The number of transitioning frames can be controlled.
5. Run PDU to the transitioning body shapes of Step 4.
6. Unshow the morphable avatar, instead show the OBJ avatar.
7. You will see the clothes are put on to the OBJ avatar.

Introduction to Landmarked OBJ:
The landmarked OBJ is a protocol (proposed by Physan) for exchanging avatar OBJ, that enables the virtual fitting system work stably without any expert supervision.

The landmarked OBJ protocol is to send the landmarked OBJ instead of the ordinary OBJ.

A landmarked OBJ is simply an ordinary avatar OBJ along with a TXT file OBLPIND.txt that lists 43 OBJ landmark vertex indices.
We will refer the 43 OBJ landmark vertices as 43 OBJLVs as shown in FIGS. 6-8.
We will refer the 43 OBJ landmark vertex indices as 43 OBJLVINDs.
We will refer the TXT file that lists the indices as OBJLVIND.txt.

The first line of the OBLPIND.txt should tell whether the avatar is {Man, Woman, Boy_1, Boy_3, Boy_5, Boy_7, Boy_9, Boy_11, Girl_1, Girl_3, Girl_5, Girl_7, Girl_9, Girl_11}.

From the second line, OBJLVIND.txt lists the vertex indices of the OBJ corresponding to the landmarks in the pre-determined order. A sample OBLIND.txt reads like: 37 54 33 . . . , which may mean Left Armpit is vertex 37, Left Bicept Front is vertex 54, Left Bicept Back is vertex 33, etc. The whole set of the landmarks and their order are summarized in the next 4 page.

If there are multiple candidate vertices (vague) for the landmark, you can choose any one of them. You do not need to be too meticulous about the vertex selection, since the result is not very sensitive to the selection.

For example, as shown in FIGS. 6-8, 43 OBJ landmark vertices may include 28 (arms)+4 (upper body)+11 (lower body).

In the arms, as shown in FIG. 6, there are 14 OBJLVs/arm, in the order of top-to-bottom: armpit, bicept front, bicept back, elbow front, elbow outer, elbow back, lower arm inner 70%, lower arm outer 70%, lower arm inner 40%, lower arm outer 40%, wrist inner, wrist outer, thumb tip, middle finger tip. Therefore, total 28 OBJLVs: left arm then right arm.

In the upper body, as shown in FIG. 7, there are 4 OBJLVs, in the order of top-to-bottom:
adam's apple front, adam's apple back, left nipple, right nipple, in total 4 OBJLVs In the lower body, as shown in FIG. 8, there are 1 Crotch, and 5 OBJLVs/leg, in the order of top-to-bottom: knee front, ankle front, ankle back, foot tip, heel, in total 1+2*5=11 OBJLVs: crotch, then left leg, then right leg.

Some of the notations in the above may be defined as follows:

lower arm inner 70% and lower arm outer 70%—Measured from the elbow to the wrist, come down 30%. That position is lower arm 70%.

lower arm inner 40% and lower arm outer 40%—Measured from the elbow to the wrist, come down 30%. That position is lower arm 70%.

Adam's Apple Front—If this landmark is not explicitly identifiable (as in the woman), pick a vertex at about ⅓ of the neck length down from the top of the neck.

Adam's Apple Back—At the same level as Adam's Apple but in the rear.

Foot Tip—If the customer is wearing shoes, this landmark is self clear. If not, then pick an appropriate vertex. The result is not very sensitive to your selection.

An aspect of the invention provides a method and system for progressive drape update on avatar morph for virtual fitting.

Figure 9:
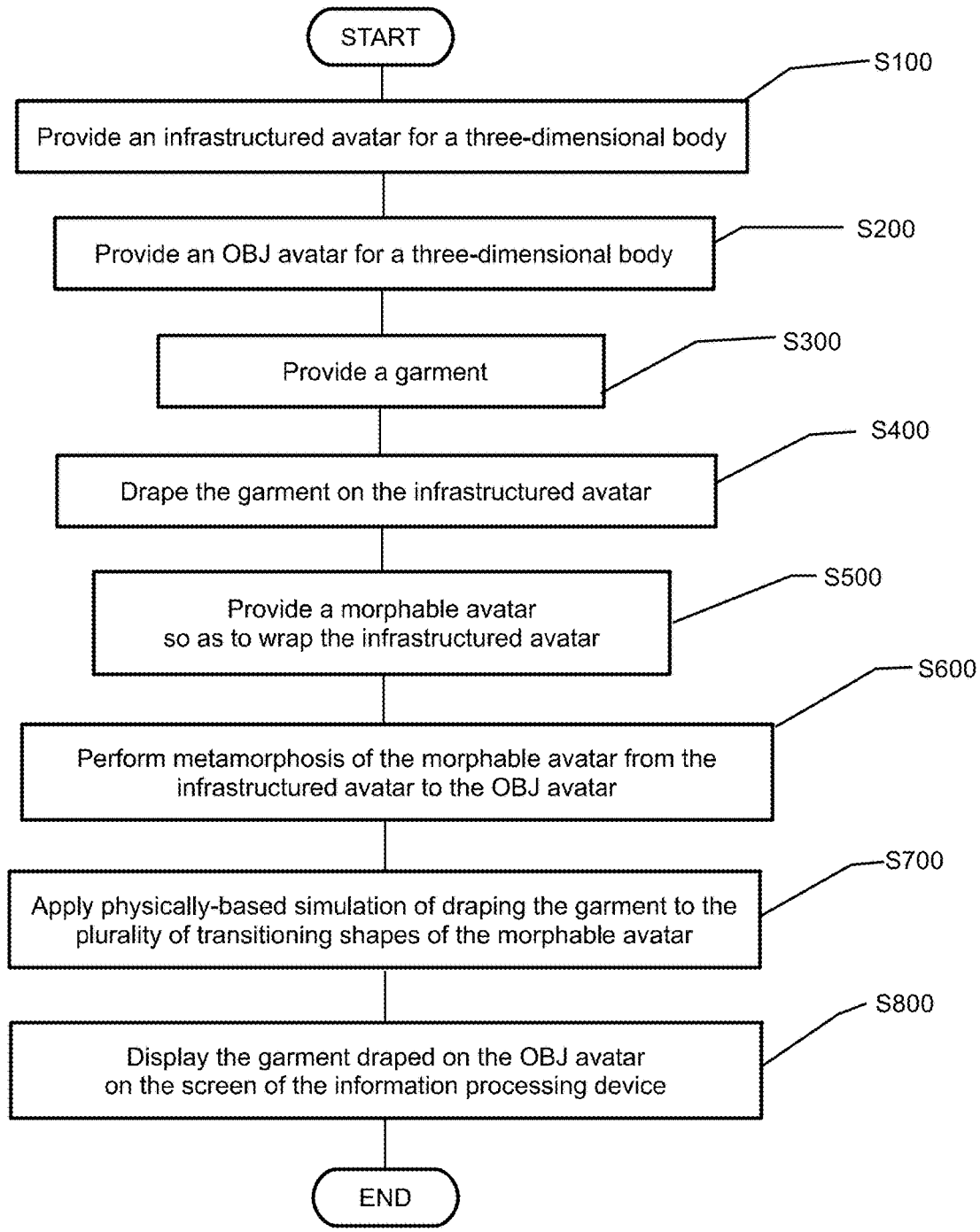
FIG. 9 is a flow chart showing a method according to an embodiment of the invention.

As shown in FIG. 9, the method for progressive drape update on avatar morph for a virtual fitting system comprises steps for:

(S100) providing an infrastructured avatar 10 for a three-dimensional body for manipulating in an information processing device 900 and displaying on a screen 920 of the information processing device 900;

(S200) providing an OBJ avatar 20 for a three-dimensional body for manipulating in the information processing device 900 and displaying on the screen 920 of the information processing device 900;

(S300) providing a garment 990 for manipulating in the information processing device 900 and displaying on the screen 920 of the information processing device 900;

(S400) draping the garment 990 on the infrastructured avatar 10 in the information processing device 900;

(S500) providing a morphable avatar 30 so as to wrap the infrastructured avatar 10 in the information processing device 900;

(S600) performing metamorphosis of the morphable avatar 30 from the infrastructured avatar 10 to the OBJ avatar 20 so as to provide a plurality of transitioning shapes of the morphable avatar 30 in the information processing device 900 as shown in FIG. 2;

(S700) applying physically-based simulation of draping the garment 990 to the plurality of transitioning shapes of the morphable avatar 30 in the information processing device 900; and (S800) displaying the garment 990 draped on the OBJ avatar 20 on the screen 920 of the information processing device 900 using a result of the physically-based simulation of draping with the last frame of the morphable avatar 30 as shown in FIG. 2.

Figure 10:
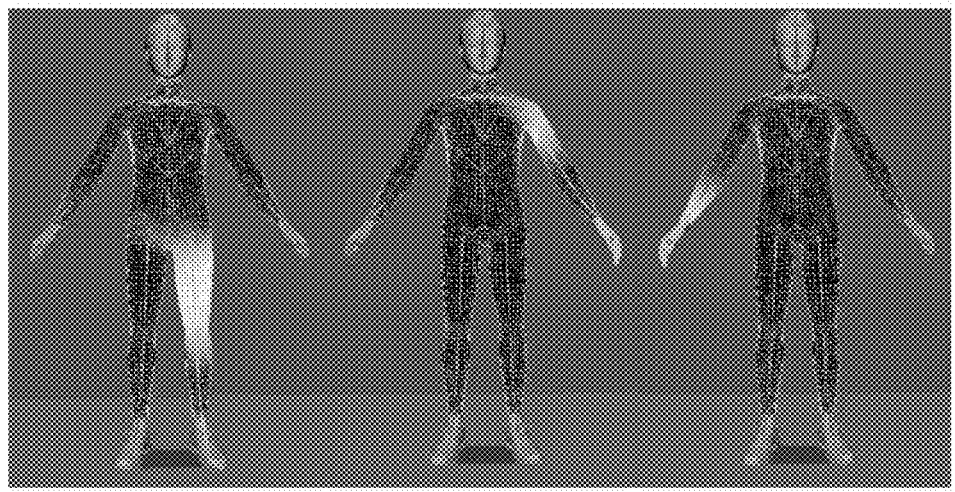
FIG. 10 shows a body mesh and a skeleton rigged to the body mesh for three different portions according to an embodiment of the invention.

As shown in FIG. 2, the infrastructured avatar may comprise a body, a head, and hairs, a plurality of collision caps 12 that wrap hands, feet, the head, and the hairs; a skeleton (a group of joints connected to each other to represent the bone structure of human body in 3D graphics) 14; a plurality of meshes (a collection of vertices, edges, and faces that defines the shape of a polyhedral object in 3D) 16 provided for portions on surfaces of the infrastrutured avatar 10 for the body and the head, and the body mesh 16 may be rigged with respect to the skeleton 14 as shown in FIG. 10, so that the body mesh 16 is configured to deform as skeletal joint angles vary.

The plurality of meshes 16 may further comprise meshes for the hairs and eyeballs.

Figure 4:
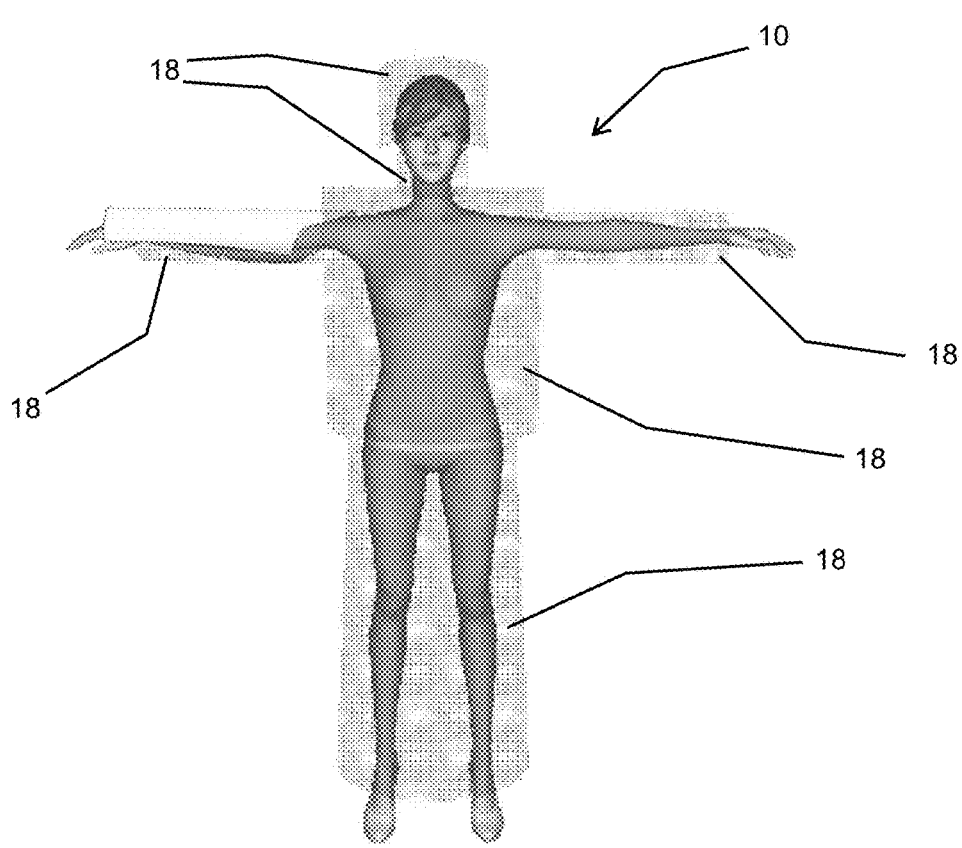
FIG. 4 is a front view of an infrastructured avatar equipped with garment layer cylinders according to an embodiment of the invention.

As shown in FIG. 4, the infrastructured avatar 10 may further comprise one or more non-avatar components such as a plurality of garment layer cylinders 18.

Figure 12:
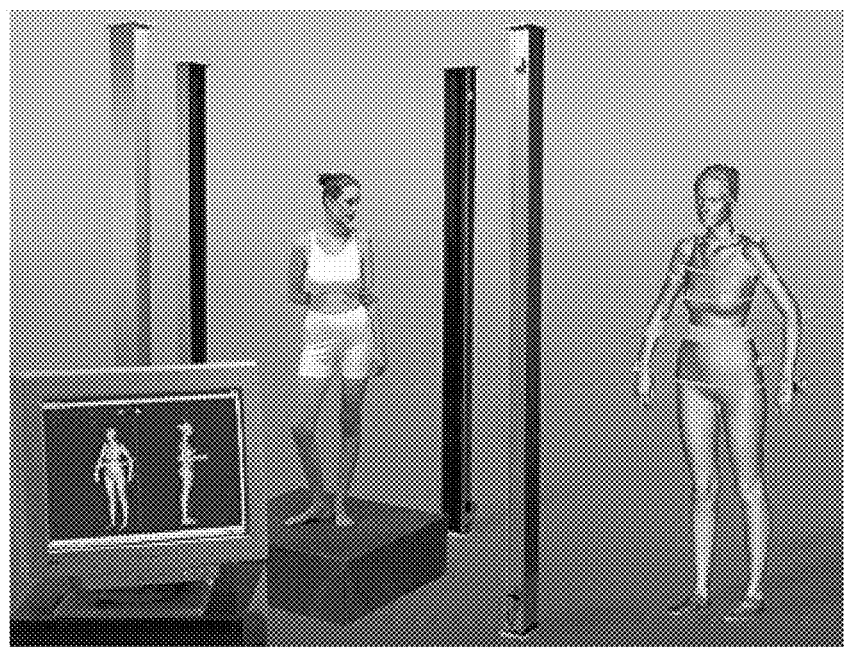
FIG. 12 is a perspective view showing a 3D body scanning system according to an embodiment of the invention.

The OBJ avatar 20 may be provided by and imported from a 3D body scanning system, which is a system of capturing the human body in 3D point cloud using a 3D body scanner as shown in FIG. 12, and the OBJ avatar 20 may have a single mesh including body, head, and hairs.

The garment 990 may be constructed by positioning and seaming panels for the garment, and each of the panels may be represented with coordinate data for points and lines forming the panel in the information processing device. The construction of the garment 990 has been described in detail in the applications by the applicant, which are incorporated by reference.

The morphable avatar 30 may comprise a single mesh and may be configured to wrap the infrastructured avatar 10, the OBJ avatar 20, and the transitioning shapes from the infrastructured avatar 10 to the OBJ avatar 20 as shown in FIG. 2.

The steps (S600 and S700) for performing metamorphosis and applying physically-based simulation may comprise a step for performing progressively physically-based update of draping of the garment 990 on the morphable avatar 30 as the infrastructured avatar 10 morphs to the OBJ avatar 20 as shown in FIG. 2.

The plurality of transitioning shapes of the morphable avatar 30 may comprise from about ten (10) to about thirty (30) frames. That is, FIG. 2 shows just a few of them for an example.

The OBJ avatar 20 may be represented by and given with an OBJ file, which is a geometry definition file format containing geometric vertices, texture coordinates, vertex normal and polygon faces, in an OBJ format as shown in FIG. 11.

The OBJ avatar 20 may be represented by and given with a landmarked OBJ protocol comprising the OBJ file and an OBJ landmark index (OBLIND) file containing a plurality of OBJ landmark indices (OBLINDs) for a plurality of landmarks (shown as red dots in FIGS. 6-8) on the OBJ avatar in a simple TXT format, and wherein the landmarks are marked at corresponding portions in both the morphable avatar 30 and the infrastructured avatar 10.

As shown in FIG. 5, the landmarks may comprise Adam's Apple, Rear Adam's Apple, L-Inner Elbow, R-Inner Elbow, L-Medial Wrist, R-Medial Wrist, L-Lateral Wrist, R-Lateral Wrist, L-Thumb Tip, R-Thumb Tip, L-Middle Finger Tip, R-Middle Finger Tip, L-Front Ankle, R-Front Ankle, L-Rear Ankle, R-Rear Ankle, L-Foot Tip, R-Foot Tip, L-Heel, and R-Heel. Of course, this exemplary choice is not limiting, but any number of any selection of landmarks can be used as long as they facilitate the processes in the present invention.

The OBLIND file may include lists of indices of the landmarks in a specific order.

The morphable avatar 30 may be made to wrap the OBJ avatar 20 with a constraint that in a wrapped result corresponding landmarks of the morphable avatar 30 and the OBJ avatar 20 coincide to each other.

The plurality of transitioning shapes of the morphable avatar 30 may comprise from about ten (10) to about thirty (30) frames including a first frame 31 and a last frame 39, and the first frame 31 may be a wrapping of the infrastructured avatar 10 and the last frame 39 is a wrapping of the OBJ avatar 20 as shown in FIG. 2.

The landmarked OBJ protocol may comprise the regular OBJ file and further an OBLPIND text file listing about forty three (43) OBJ landmark vertex indices.

The OBLPIND text file may have a first line indicating information on the avatar, and the OBLPIND text file may list the OBJ landmark vertex indices in a predetermined order.

The OBJ landmark vertices may comprise about twenty eight (28) vertices in arms, about four (4) vertices in an upper body, and about eleven (11) vertices in a lower body. However, the number and position of the vertices may be varied according to the situation of the method, and therefore are not limiting to an exact number and positions.

The vertices in the arms may be located at armpit, bicept front, bicept back, elbow front, elbow outer, elbow back, lower arm inner 70%, lower arm outer 70%, lower lower arm outer 40%, wrist inner, wrist outer, thumb tip, and middle finger tip. The vertices in the upper body may be located at Adam's apple front, Adam's apple back, left nipple, and right nipple, and the vertices in the lower body may be located at crotch, knee front, ankle front, ankle back, foot tip, and heel. These definitions can be also modified.

FIGS. 10-12 show a body mesh, a skeleton, an OBJ format, and a 3D body scanning system according to embodiments of the invention.

In FIG. 10, the body mesh is rigged to an appropriate part of the skeleton for examples. The highlighted area shows that the model's thigh, shoulder, forearm is rigged to the thigh bone, shoulder blade, and forearm bone respectively.

As discussed in the above, the skeleton 14 comprises a group of joints connected to each other to represent the bone structure of human body in 3D graphics, each of the plurality of meshes 16 comprises a collection of vertices, edges, and faces that defines the shape of a polyhedral object in 3D and is provided for portions on surfaces of the infrastructured avatar 10 for the body and the head, and the body mesh 16 is rigged with respect to the skeleton 14.

And the 3D body scanning system is a system for capturing the human body in 3D point cloud using a 3D body scanner and storing the captured data in the information processing device for further manipulating and calculating. The mesh, the skeleton, or the avatar is represented in terms of electronic data set in the information processing device and the electronic data set can be stored in one or more memory device in the information processing device and manipulated or calculated for each of the steps of the method of the invention, changing the physical states of the components of the information processing device. Those manipulated and calculated electronic data set, which was not there in the begging of the method, can be used to display the avatar draped newly and inventively with a new garment. The basic definition of avatar with its components such as meshes and skeleton is known to the community of the art and the previous applications by the inventor, which are incorporated by reference in the above.

While the invention has been shown and described with reference to different embodiments thereof, it will be appreciated by those skilled in the art that variations in form, detail, compositions and operation may be made without departing from the spirit and scope of the invention as defined by the accompanying claims.

What is claimed is:

1. A method for progressive drape update on avatar morph for a virtual fitting system, the method comprising steps for:
   providing an infrastructured avatar for a three-dimensional body for manipulating in an information processing device and displaying on a screen of the information processing device;
   providing an OBJ avatar for a three-dimensional body for manipulating in the information processing device and displaying on the screen of the information processing device;
   providing a garment for manipulating in the information processing device and displaying on the screen of the information processing device;
   draping the garment on the infrastructured avatar in the information processing device;
   providing a morphable avatar so as to wrap the infrastructured avatar in the information processing device;
   performing metamorphosis of the morphable avatar from the infrastructured avatar to the OBJ avatar so as to provide a plurality of transitioning shapes of the morphable avatar in the information processing device;
   applying physically-based simulation of draping the garment to the plurality of transitioning shapes of the morphable avatar in the information processing device; and
   displaying the garment draped on the OBJ avatar on the screen of the information processing device using a result of the physically-based simulation of draping with the last frame of the morphable avatar,
   wherein the infrastructured avatar comprises:
   a body, a head, and hairs;
   a plurality of collision caps that wrap hands, feet, the head, and the hairs;
   a skeleton;
   a plurality of meshes provided for portions on surfaces of the infrastrutured avatar for the body and the head, wherein the body mesh is rigged with respect to the skeleton, so that the body mesh is configured to deform as skeletal joint angles vary.

2. The method of claim 1, wherein the plurality of meshes further comprise meshes for the hairs and eyeballs.

3. The method of claim 1, wherein the infrastructured avatar further comprises one or more non-avatar components such as a plurality of garment layer cylinders.

4. The method of claim 1, wherein the OBJ avatar is provided by and imported from a 3D body scanning system, wherein the OBJ avatar has a single mesh including body, head, and hairs.

5. The method of claim 1, wherein the garment is constructed by positioning and seaming panels for the garment, wherein each of the panels is represented with coordinate data for points and lines forming the panel in the information processing device.

6. A method for progressive drape update on avatar morph for a virtual fitting system, the method comprising steps for:
providing an infrastructured avatar for a three-dimensional body for manipulating in an information processing device and displaying on a screen of the information processing device;
providing an OBJ avatar for a three-dimensional body for manipulating in the information processing device and displaying on the screen of the information processing device;
providing a garment for manipulating in the information processing device and displaying on the screen of the information processing device;
draping the garment on the infrastructured avatar in the information processing device;
providing a morphable avatar so as to wrap the infrastructured avatar in the information processing device;
performing metamorphosis of the morphable avatar from the infrastructured avatar to the OBJ avatar so as to provide a plurality of transitioning shapes of the morphable avatar in the information processing device;
applying physically-based simulation of draping the garment to the plurality of transitioning shapes of the morphable avatar in the information processing device; and
displaying the garment draped on the OBJ avatar on the screen of the information processing device using a result of the physically-based simulation of draping with the last frame of the morphable avatar,
wherein the morphable avatar comprises a single mesh and is configured to wrap the infrastructured avatar, the OBJ avatar, and the transitioning shapes from the infrastructured avatar to the OBJ avatar.

7. The method of claim 1, wherein the steps for performing metamorphosis and applying physically-based simulation comprise a step for performing progressively physically-based update of draping of the garment on the morphable avatar as the infrastructured avatar morphs to the OBJ avatar.

8. The method of claim 7, wherein the plurality of transitioning shapes of the morphable avatar comprise from about ten (10) to about thirty (30) frames.

9. The method of claim 1, wherein the OBJ avatar is represented by and given with an OBJ file including a geometry definition file format containing geometric vertices, texture coordinates, vertex normal and polygon faces in an OBJ format.

10. A method for progressive drape update on avatar morph for a virtual fitting system, the method comprising steps for:
providing an infrastructured avatar for a three-dimensional body for manipulating in an information processing device and displaying on a screen of the information processing device;
providing an OBJ avatar for a three-dimensional body for manipulating in the information processing device and displaying on the screen of the information processing device;
providing a garment for manipulating in the information processing device and displaying on the screen of the information processing device;
draping the garment on the infrastructured avatar in the information processing device;
providing a morphable avatar so as to wrap the infrastructured avatar in the information processing device;
performing metamorphosis of the morphable avatar from the infrastructured avatar to the OBJ avatar so as to provide a plurality of transitioning shapes of the morphable avatar in the information processing device;
applying physically-based simulation of draping the garment to the plurality of transitioning shapes of the morphable avatar in the information processing device; and
displaying the garment draped on the OBJ avatar on the screen of the information processing device using a result of the physically-based simulation of draping with the last frame of the morphable avatar,
wherein the OBJ avatar is represented by and given with an OBJ file including a geometry definition file format containing geometric vertices, texture coordinates, vertex normal and polygon faces in an OBJ format,
wherein the OBJ avatar is represented by and given with a landmarked OBJ protocol comprising the OBJ file and an OBJ landmark index (OBLIND) file containing a plurality of OBJ landmark indices (OBLINDs) for a plurality of landmarks on the OBJ avatar in a simple TXT format, and wherein the landmarks are marked at corresponding portions in both the morphabelavatar and the infrastructured avatar.

11. The method of claim 10, wherein the landmarks comprise Adam's Apple, Rear Adam's Apple, L-Inner Elbow, R-Inner Elbow, L-Medial Wrist, R-Medial Wrist, L-Lateral Wrist, R-Lateral Wrist, L-Thumb Tip, R-Thumb Tip, L-Middle Finger Tip, R-Middle Finger Tip, L-Front Ankle, R-Front Ankle, L-Rear Ankle, R-Rear Ankle, L-Foot Tip, R-Foot Tip, L-Heel, and R-Heel.

12. The method of claim 11, wherein the OBLIND file includes lists of indices of the landmarks in a specific order.

13. The method of claim 12, wherein the morphable avatar is made to wrap the OBJ avatar with a constraint that in a wrapped result corresponding landmarks of the morphable avatar and the OBJ avatar coincide to each other.

14. The method of claim 13, wherein the plurality of transitioning shapes of the morphable avatar comprise from about ten (10) to about thirty (30) frames including a first frame and a last frame, and wherein the first frame is a wrapping of the infrastructured avatar and the last frame is a wrapping of the OBJ avatar.

15. The method of claim 10, wherein the landmarked OBJ protocol comprises the OBJ file and an OBLPIND text file listing about forty three (43) OBJ landmark vertex indices.

16. The method of claim 15, wherein the OBLPIND text file has a first line indicating information on the avatar, and wherein the OBLPIND text file lists the OBJ landmark vertex indices in a predetermined order.

17. The method of claim 16, wherein the OBJ landmark vertices comprise about twenty eight (28) vertices in arms, about four (4) vertices in an upper body, and about eleven (11) vertices in a lower body.

18. The method of claim 17, wherein the vertices in the arms are located at armpit, bicept front, bicept back, elbow front, elbow outer, elbow back, lower arm inner 70%, lower arm outer 70%, lower lower arm outer 40%, wrist inner, wrist outer, thumb tip, and middle finger tip, wherein the vertices in the upper body are located at Adam's apple front, Adam's apple back, left nipple, and right nipple, and wherein the vertices in the lower body are located at crotch, knee front, ankle front, ankle back, foot tip, and heel.

\* \* \* \* \*